(12) United States Patent
Motz

(10) Patent No.: US 8,674,690 B2
(45) Date of Patent: Mar. 18, 2014

(54) FEEDBACK CONTROL CIRCUIT FOR A HALL EFFECT DEVICE

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 13/570,969

(22) Filed: Aug. 9, 2012

(65) Prior Publication Data

US 2014/0043085 A1   Feb. 13, 2014

(51) Int. Cl.
*G01R 33/07* (2006.01)

(52) U.S. Cl.
USPC .......................................... 324/251; 324/225

(58) Field of Classification Search
USPC ................................................. 324/251, 225
See application file for complete search history.

(56) References Cited

U.S. PATENT DOCUMENTS

| 5,604,433 A | 2/1997 | Theus et al. |
| 2003/0102909 A1 | 6/2003 | Motz |

FOREIGN PATENT DOCUMENTS

DE     10213687 B4    7/2005

OTHER PUBLICATIONS

Motz, et al. "A Chopped Hall Sensor With Small Jitter and Programmable "True Power-On" Function" IEEE Journal of Solid-State Circuits, vol. 40, No. 7, Jul. 2005. 8 Pages.
Draxelmayr, et al. "A Self-Calibrating Hall Sensor IC With Direction Detection" IEEE Journal of Solid-State Circuits, vol. 38, No. 7, Jul. 2003. 6 Pages.

*Primary Examiner* — Reena Aurora
(74) *Attorney, Agent, or Firm* — Eschweiler & Associates, LLC

(57) ABSTRACT

A feedback control circuit comprises an adjustable element, a main signal path and a feedback control loop. The adjustable element is configured to offset a signal in accordance with an offset control signal and output an offset signal. The main signal path comprises a first comparator to process the offset signal to output a main signal. The feedback control loop comprises a second comparator to process the offset signal to output a tracking signal, a first signal evaluator to evaluate the tracking signal and a first controller to output the offset control signal based on the evaluated tracking signal. The feedback control loop further comprises a second signal evaluator to detect a difference between a signal property of the main signal and the tracking signal and a second controller to control one of the comparators or the adjustable element such that the difference is reduced.

26 Claims, 7 Drawing Sheets

FEEDBACK CONTROL CIRCUIT FOR A HALL EFFECT DEVICE

FIELD

Embodiments of the invention refer to a feedback control circuit for a Hall Effect device, to a regulated sensor and to a method for regulating a Hall Effect device.

BACKGROUND

A magnetic field or a magnetic flux may be detected by using a Hall Effect or XMR device (X-magneto-resistive sensor, e.g. AMR, GMR or TMR sensor). Thus, the Hall or XMR Effect device may be used for detecting a variation of a magnetic field, e.g. caused by a rotary motion of a camshaft wheel. Typically such a camshaft wheel has a notch or a tooth which influences the magnetic field of a fixed permanent magnet. This variation in the magnetic flux is found in an air gap between the permanent magnet and the passing camshaft wheel. Thus, the Hall or XMR Effect device provides a contactless monitoring of a speed or a position of a rotating element like a camshaft.

Hall Effect and XMR devices are based on the principle that a present magnetic field influences an output current or voltage in a magnetic field detecting element and thus a distribution of charged density across the magnetic field detecting element. This (asymmetric) distribution of the charge results in an electric potential across the magnetic field detecting element and in a voltage or a current, respectively. The voltage, also referred to as Hall voltage, provides information on the magnetic flux.

The signal of the Hall Effect device, e.g., a differential signal having a sine shape resulting from a motion of a camshaft wheel (where the maximum and the minimum of the sine signal correspond to a tooth and a notch of the wheel), may be digitally processed. Thus, the signal of the Hall or XMR Effect device is offset in order to compensate for effects like a temperature drift.

SUMMARY

An embodiment of the invention provides a feedback control circuit for a Hall Effect device which comprises an adjustable element, a main signal path and a feedback control loop. The adjustable element is configured to offset a signal of the Hall Effect device in accordance with an offset control signal and to output an offset signal. The main signal path comprises a first comparator configured to process the offset signal to output a main signal. The feedback control loop comprises a second comparator configured to process the offset signal to output a tracking signal, a first signal evaluator configured to evaluate the tracking signal, and a first controller configured to output the offset control signal based on the evaluated tracking signal. The feedback control loop further comprises a second signal evaluator configured to detect a difference between a signal property of the main signal and the tracking signal, and a second controller configured to control one of the comparators or the adjustable element such that the difference is reduced.

A further embodiment provides a feedback control circuit for a Hall Effect device which comprises an adjustable element, a main signal path and a feedback control loop. The adjustable element is configured to offset a signal of the Hall Effect device in accordance with an offset control signal and to output an offset signal. The main signal path comprises a first multistage low pass filter and a first comparator configured to process the low pass filtered offset signal to output a digital main signal having a rising and a falling edge. The feedback control loop comprises a second low pass filter having, in one embodiment, a faster filter response when compared to a filter response of the first multistage low pass filter, a second comparator configured to process the low pass filtered offset signal to output a digital tracking signal having a rising and a falling edge, a first signal evaluator configured to evaluate the tracking signal, and a first controller configured to output the offset control signal based on the evaluated tracking signal. A first delay between the rising edges of the main signal and of the tracking signal, and a second delay between the falling edges of the main signal and of the tracking signal are caused by the different filter responses of the first and second low pass filter and the offset difference between the main comparator and tracking comparator. The feedback control loop comprises a second signal evaluator configured to determine a time difference between the first and second delay, and a second controller configured to output an operating point signal to the second comparator such that an operating point of the second comparator is adjusted in order to balance component tolerances between the first and second comparator, wherein the operating point is adjusted until the time difference is reduced.

A further embodiment provides a feedback control circuit for a Hall Effect device, and comprises means for offsetting a signal of the Hall Effect device in accordance with an offset control signal and for outputting an offset signal. The feedback control circuit further comprises means for processing the offset signal to output a main signal and means for processing the offset signal to output a tracking signal, means for evaluating the tracking signal, and for outputting the offset control signal based on the evaluated tracking signal. The feedback control circuit further comprises means for detecting a difference between a signal property of the main signal and the tracking signal, and for controlling one of the comparators or the means for offsetting such that the difference is reduced.

A further embodiment provides a regulated sensor comprising a Hall Effect device and a feedback control circuit. The feedback control circuit comprises an adjustable element, a main signal path and a feedback control loop. The adjustable element is configured to offset a signal of the Hall Effect device in accordance with an offset control signal and to output an offset signal. The main signal path comprises a first comparator configured to process the offset signal to output the main signal. The feedback control loop comprises a second comparator configured to process the offset signal to output a tracking signal, a first signal evaluator configured to evaluate the tracking signal, and a first control configured to output the offset control signal based on the evaluated tracking signal. The feedback control loop further comprises a second signal evaluator configured to detect a difference between a signal property of the main signal and the tracking signal, and a second controller configured to control one of the comparators or the adjustable element such that the difference is reduced.

A further embodiment provides a method for regulating a Hall Effect device, wherein the method comprises offsetting a signal of the Hall Effect device in accordance with an offset control signal, outputting an offset signal, processing the offset signal to output a main signal. The method further comprises processing the offset signal to output a tracking signal, evaluating the tracking signal, outputting the offset control signal based on the evaluated tracking signal. Furthermore, the method comprises detecting a difference between a signal property of the main signal and the tracking signal, and controlling one of the comparators or the offset control signal such that the difference is reduced.

BRIEF DESCRIPTION OF THE DRAWINGS

Embodiments of the present invention are described in the following with respect to the figures.

FIG. 1b is a diagram of a main signal and a tracking signal plotted over the time for illustrating an offset mismatch caused by the feedback control circuit of FIG. 1a;

DETAILED DESCRIPTION

Figure 1A:
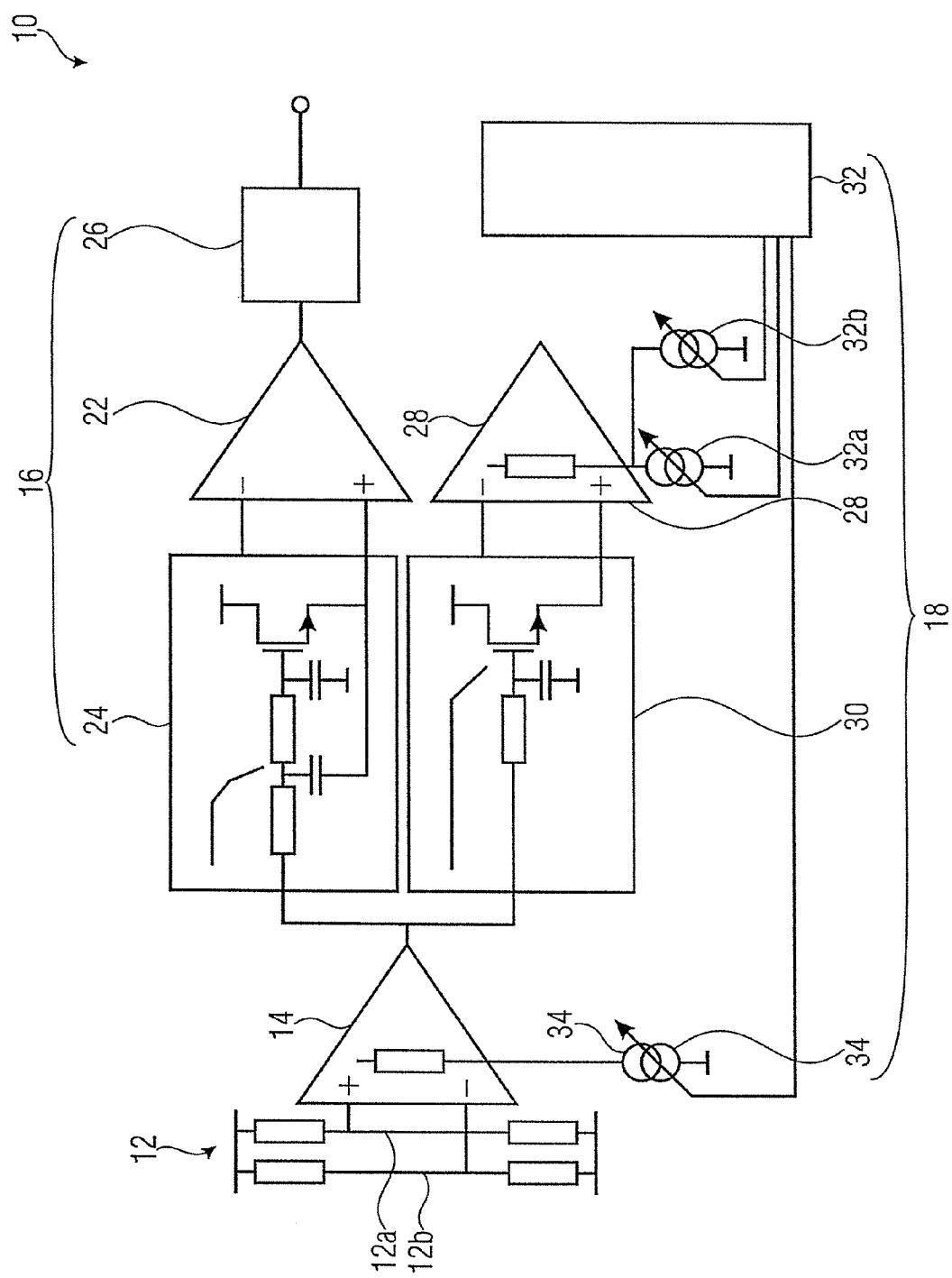
FIG. 1a is an example block diagram of a conventional regulated sensor comprising a feedback control circuit having a main signal path and a tracking signal path.

Different embodiments of the teachings disclosed herein will subsequently be discussed referring to FIG. 2a to FIG. 4. In the drawings, identical reference numerals are provided to objects having identical or similar functions so that objects referred to by identical reference numerals within the different embodiments are interchangeable and the description is mutually applicable.

Referring to FIG. 1a, a state of the art feedback control circuit and its drawbacks will be discussed, wherein an improved approach starting from the state of the art feedback control circuit will be discussed in FIG. 2.

FIG. 1a shows a regulated sensor 10 comprising a Hall Effect device 12, an adjustable element 14, a main signal path 16 and a feedback control loop 18 (in the tracking signal path). The Hall effect device 12 is illustrated here by two parallel resistance bridges 12a and 12b, wherein the adjustable element 14 (e.g. a pre-amplifier) is connected to a center tap of the resistance bridge 12a and to a center tap of the second resistance bridge 12b via its differential input. The adjustable element 14 is connected via its (single-ended) output to the main signal path 16 comprising a first comparator 22 (e.g. a chopped or outer zeroing comparator) and a first active low pass filter 24 arranged between the first comparator 22 and the output of the adjustable element 14. The main signal path 16 may optionally comprise an enable logic 26 connected to an output of the first comparator 22.

The adjustable element 14 is further connected via its output to the feedback control loop 18 which is, vice versa, connected to an offset signal input of the adjustable element 14 in order to control same. The feedback control loop 18 comprises a second comparator 28 and a second active low pass filter 30 arranged between the second comparator 28 and the output of the adjustable element 14. Furthermore, the feedback control loop 18 comprises a first signal evaluator 32 connected to the second comparator 28 in order to evaluate the tracking signal in the tracking signal path. The feedback control loop 18 is closed by a first controller 34, e.g. a digital-to-analog converter, which is arranged between the first signal evaluator 32 and the offset signal input of the adjustable element 14.

The feedback control loop 18 has the purpose to adjust the adjustable element 14 such that a signal of the Hall Effect device 12 (hereafter named Hall Effect signal), e.g. a voltage difference (Hall voltage) between the two center taps of the resistance bridges 12a and 12b (assuming that a bias across the two parallel resistance bridges 12a and 12b is applied), is offset in order to compensate effects like a temperature drift. Background thereof is that the Hall Effect signal may be a sine signal having a frequency between 10 or 50 kHz or another alternating signal resulting from an oscillating variation of a magnetic field (cf. rotating motion), wherein the signal may have a DC component. Due to offsetting the Hall Effect signal, the DC component is adapted such that the (analog) sine signal, also referred to as offset signal, may be processed in the main signal path. It should be noted that in this implementation the differential Hall Effect signal is converted into a single-ended signal by the adjustable element 14. This (single-ended) offset signal is processed in the main signal path 16 by the first low pass filter 24 and by the first comparator 22. The low pass filter 24 which is typically realized as an active two stage low pass filter (combination of two low pass filters) having a high Q factor reduces a high frequency noise of the offset signal. The first comparator 22 compares the offset signal and the voltage, respectively, with a fixed threshold value (e.g. 0V) in order to digitalize the offset signal and to output a main signal to the optional enable logic 26. Here, the comparator 22 switches the output from a low level to a high level when the signal value is larger than the threshold value and, vice versa, switches to the low level when the input value is smaller than the threshold value. The first comparator 22 may optionally comprise a hysteresis in order to avoid switching at zero crossing due to noise. Alternatively, a non-hysteresis comparator may be coupled with a Schmitt trigger such that a hidden hysteresis is generated. Here, the comparator 22 may be designed as a zero-detector. Thus, a 50% duty cycle may be generated when the input signal is an oscillating signal swinging between a minimum value and a maximum value, wherein the minimum value has the same absolute value when compared to the maximum value. In turn, it means that the offsetting of the Hall Effect signal (by using the adjustable element 14) enables to adapt the range of the offset signal (between the maximum and the minimum value) and thus the duty cycle. Therefore, the offset signal is selected such that a targeted duty cycle (e.g. 40% or 50% duty cycle) is output by the comparator 22 independently from any effects like temperature or lifetime drifts.

As explained above, the adaption of the offset is performed by the adjustable element 14 which is controlled via the feedback control loop 18. In the feedback control loop 18 the offset signal output by the adjustable element 14 is processed, namely low pass filtered by the second filter 30, e.g. an active simple low pass filter which has a preferably faster filter response when compared to the filter response of the first filter 24, and digitalized by a second comparator 28, which is comparable with the first comparator 22. The second comparator 28 also outputs a digital signal, namely the so-called tracking signal, which is evaluated by the signal evaluator 32. Based on the evaluated signal the controller 34, e.g. a digital-to-analog converter, outputs an offset control signal, e.g. a current, to the adjustable element 14. Expressed in other words, the controller 34 forms the power supply of the adjustable element 14, wherein an operating point of the adjustable element (gain factor in case of a pre-amplifier) is controlled by the controller 34. This "balancing" of the offset is performed during several periods of the Hall Effect signal, wherein each adjustment may be limited to a few LSBs (Least Significant Bit) per zero crossing. The evaluation of the digital tracking signal performed by the signal evaluator 32 is typically based on a so-called tracking algorithm which is configured to detect a slope or a peak of the tracking signal and to calculate a resulting offset control signal. Thus, the signal evaluator 32 may comprise a slope/peak detection at the offset calculator which outputs the offset control signal to the adjustable element 14 via the controller 34, wherein the controller 34 converts the digital offset control signal in an analog offset control signal.

The second comparator 28 is similar to the first comparator 22, so also has a limited bandwidth. In order to increase the bandwidth, an operating point of the second comparator 28 may be varied during the signal evaluation. Therefore, the signal evaluator 32 comprises a tracking controller 32a, e.g. a further current-steering-DAC, which outputs an oscillating operating point signal to the second comparator 28 so that its operating point is varied at a sampling frequency. Due to the high sampling frequency, e.g. 2 or 10 MHz, which is larger when compared to the frequency of the offset signal, the offset signal may be sampled. The sampling frequency is selected such that the delay difference ($d_b-d_a$) is digitalized or sampled with sufficient precision. So, the sampling frequency is typically more than 10 times larger compared to a reciprocal of the delay difference (i.e. $1/(d_b-d_a)$). In other words, the digitalization in the feedback control loop 18 is done by a combination of a low resolution ADC and a programmable gain amplifier instead of a high resolution ADC. The signal evaluator 32 may further comprise an optional dither controller 32b (e.g. also a DAC) which is configured to output a high-frequency-signal, e.g. triangle signal, a saw tooth signal or another pseudo-random signal, overlaid over the operating point signal. Due to this dithering signal applied to the second controller 28 a sampling accuracy may be increased. Due to this dithering effect the offset signal may be sampled with a higher resolution of 11 to 14 bits. It should be noted that the tracking signal is typically low pass filtered when a dither signal is overlaid. Thus, the signal evaluator 32 may comprise a low pass filter for averaging. In order to perform quickly the offsetting of the Hall Effect signal, the filter 30 in the feedback loop 18 may have a preferably faster filter response when compared to the filter 24 in the main signal path. This different filter characteristic leads to a phase shift of the main signal when compared to the tracking signal as illustrated by FIG. 1b.

Figure 1B:
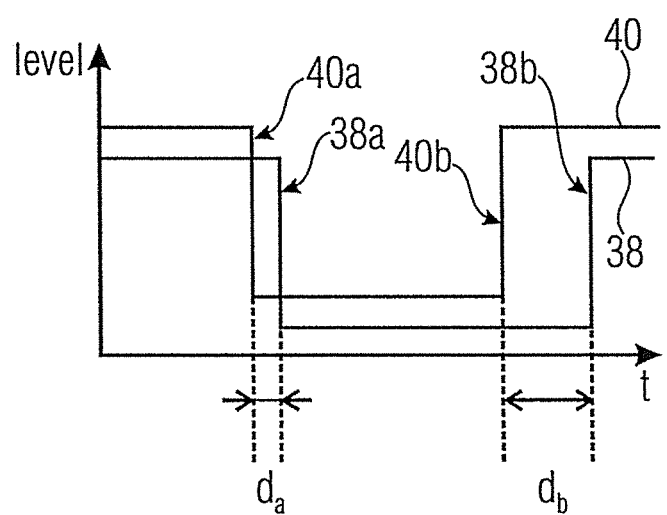

FIG. 1b shows a diagram of the main signal 38 and the tracking signal 40 plotted over the time. As illustrated, both signals 38 and 40 are digital signals having rising and falling edges between its respective low levels and high levels. As discussed above, the main signal 38 is delayed when compared to the tracking signal 40. However, a delay $d_a$ (e.g. 4 μs) between the falling edges 38a and 40a of the main signal 38 and the tracking signal 40 differs from a delay $d_b$ (e.g. 10 μs) between the rising edges 38b and 40b of the main signal 38 and the tracking signal 40. The background thereof is that a mismatch between the main and tracking comparator (cf. comparators 22 and 28) exists. This mismatch is due to component tolerances between the two comparators 22 and 28. This results in a duty cycle error or even missing pulses as explained with respect to FIG. 1c.

Figure 1C:
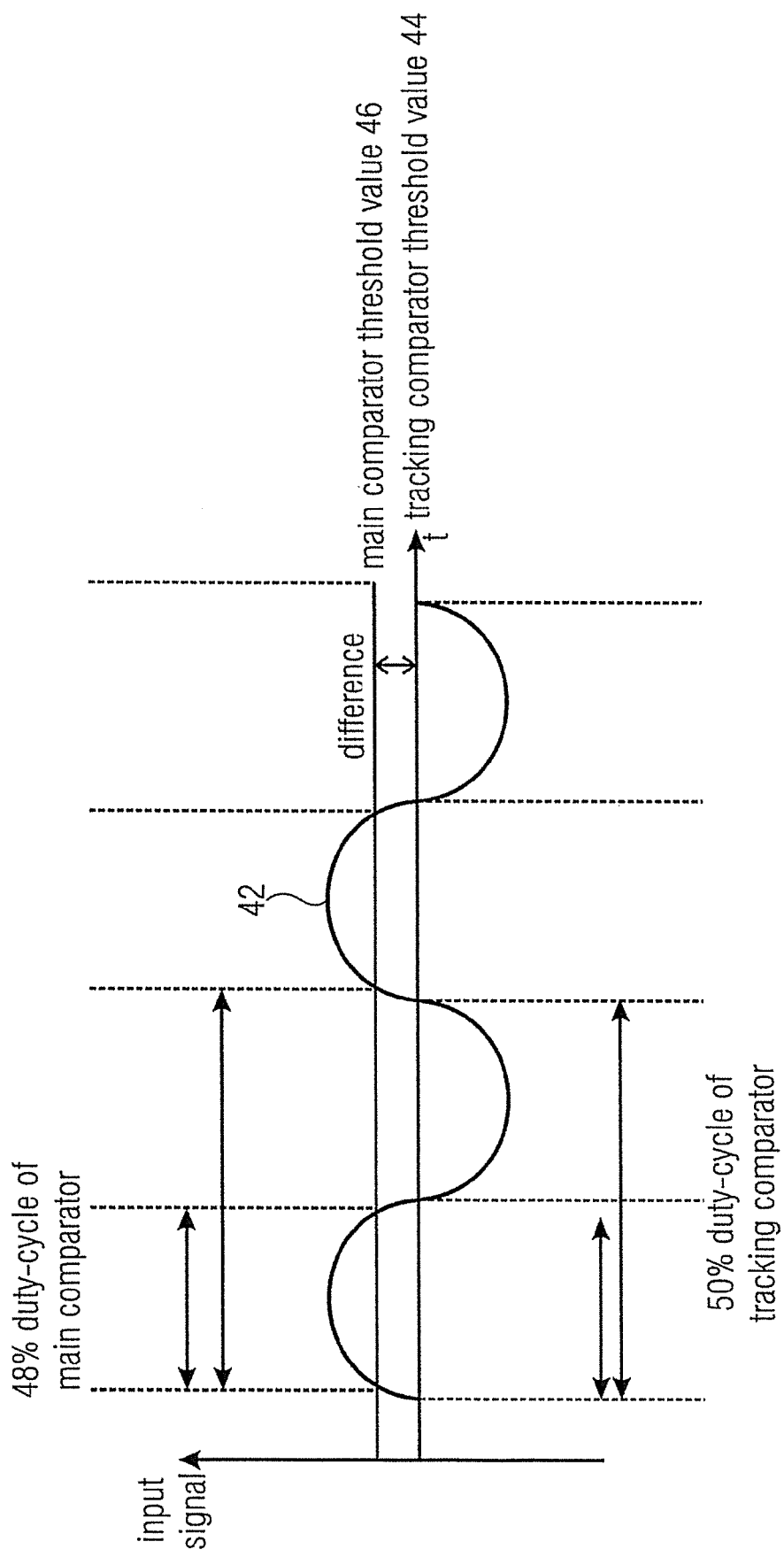
FIG. 1c is a graph of an input signal of a Hall effect device in combination with the switching thresholds of the main signal path and of the tracking signal path for illustrating an influence of the offset mismatch on a duty-cycle.

FIG. 1c shows an input signal 42, namely an oscillating signal plotted over time. As shown, the input signal 42 is offset by using the feedback control loop of FIG. 1a. This offsetting is made in order to achieve a 50% duty cycle. Therefore, the offset control signal is adjusted until an average value of the signal 42 is equal to the threshold value 44 of the tracking comparator (c.f. comparator 28 of the feedback control loop 18). Consequently, a 50% duty cycle may be generated when the feedback control loop is considered in isolation. However, due to the differences between the tracking comparator and the main comparator, a threshold value 46 of the main comparator is shifted when compared to the threshold value 44 of the tracking comparator 28. Consequently, a duty cycle mismatch is generated in the main signal path so that the duty cycle in the main signal path may be approximately 48%.

A common solution for avoiding such offset mismatches is to use auto zeroing or chopped comparators in the main signal path and the feedback control loop, but this comparator creates additional noise or ripple problems which degrades the jitter performance of the Hall Effect device. Therefore, there is the need for an improved approach which will be discussed referring to FIG. 2a.

Figure 2A:
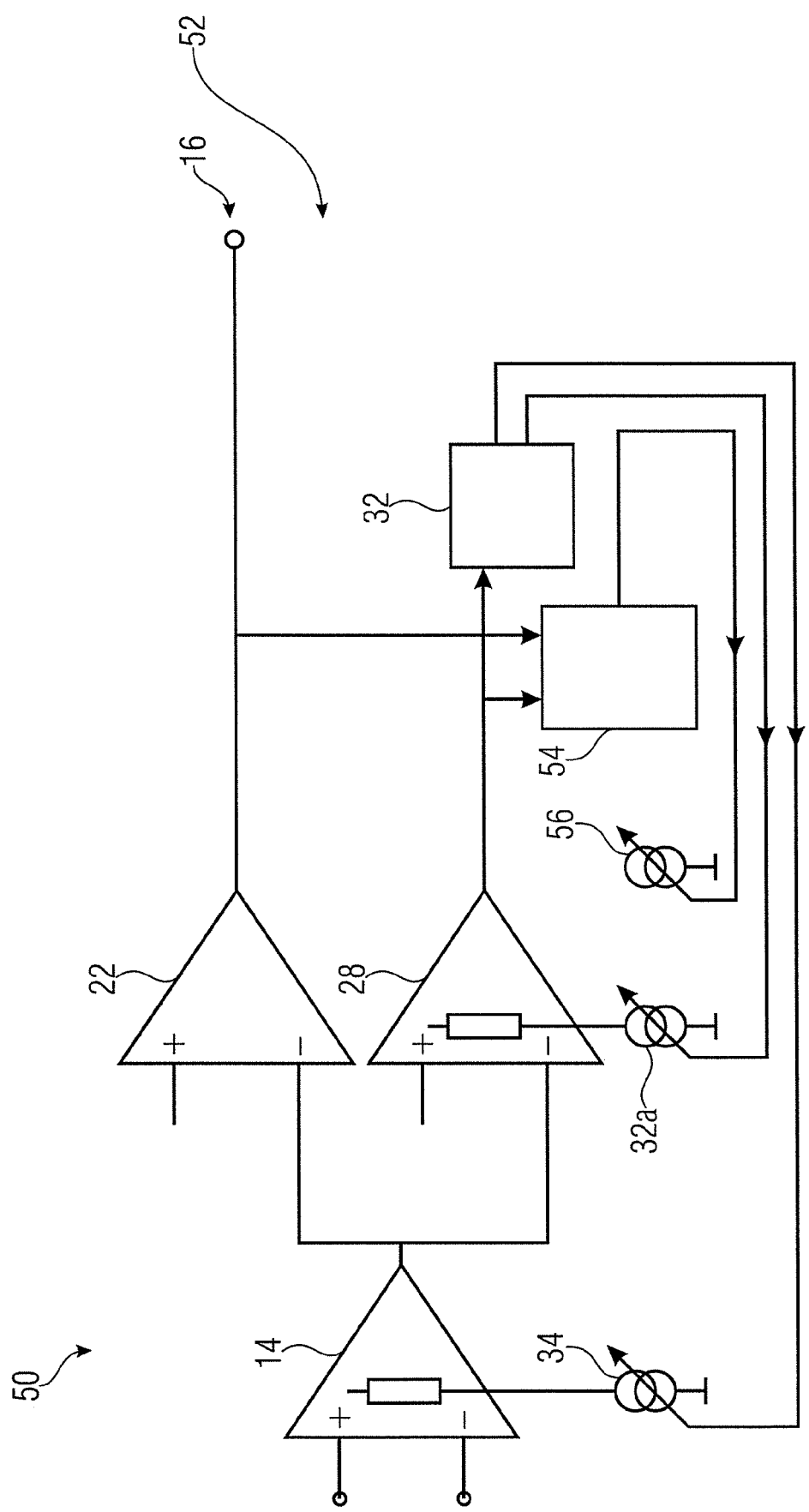
FIG. 2a is an example block diagram of a feedback control circuit for a Hall Effect device according to an embodiment.

FIG. 2a shows a feedback control circuit 50 which comprises the adjustable element 14, the comparator 22 in the main signal path 16 and an enhanced feedback control loop 52. The feedback control loop 52 comprises the second comparator 28, the signal evaluator 32 carrying the tracking controller 32a as well as the first controller 34 for outputting the feedback control signal to the adjustable element 14. The structure of these elements in the enhanced feedback control loop 52 is substantially equal to the feedback control loop 18 shown in FIG. 1a. In contrast, the enhanced feedback control loop 52 comprises a second signal evaluator 54 and a second controller 56. The second signal evaluator 54 is connected to the output of the second comparator 28 and to the output of the first comparator 22 such that same can receive and compare the main signal and the tracking signal. Furthermore, the second signal evaluator 54 is connected via the second controller 56 to the second comparator 28, wherein the second controller 56 is arranged in parallel to the tracking controller 32a and, thus, also configured to switch the operating point of the second comparator 28.

Due to the comparison of the main signal and the tracking signal, a difference between the main signal and the tracking signal or, in more detail, the difference between a property of the main signal and the tracking signal may be detected by the second signal evaluator 54. Here, in one embodiment the detected difference is the difference between the two delays $d_a$ and $d_b$ (cf. FIG. 1b), wherein the delay difference ($d_b-d_a$) is nearly independent of the frequency of the main signal and tracking signal, respectively. So, the second signal evaluator 54 is configured to analyze and compare the main signal and the tracking signal regarding its time characteristic and regarding its phase characteristic, respectively, wherein a delay counting range may, for example, be between 0.1 μs up to 50 μs.

Figure 2B:
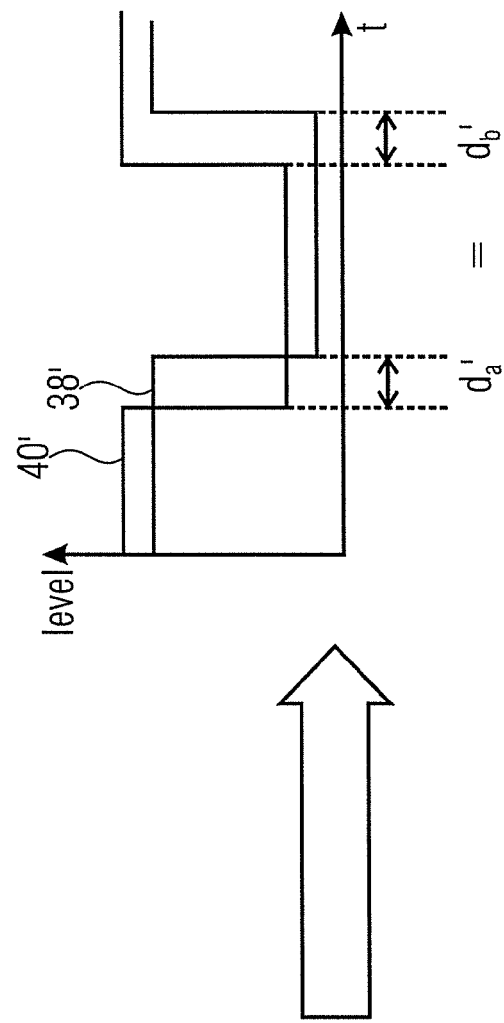
FIG. 2b is a graph that shows a comparison of the diagram of FIG. 1b and a similar diagram resulting from the feedback control loop of FIG. 2a for illustrating performance improvement.
Figure 2B:
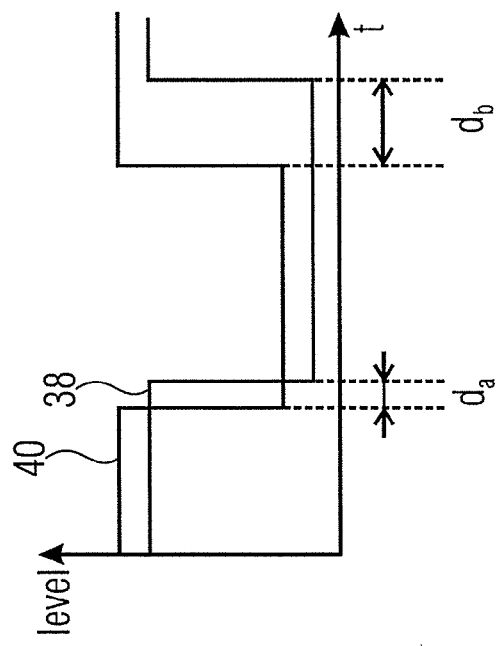

Based on this detected delay difference ($d_b-d_a$) the operating part of the second comparator 28 is adapted in order to reduce this delay difference (or in one embodiment up to the delay difference is minimized or even equal to zero), as illustrate by FIG. 2b. The adaption of the operating point of the second comparator 28 is performed by using the second controller 56 which may be a DAC configured to convert a digital operation point signal output from the second signal evaluator 54 into an analog operation point signal, e.g. a current or a voltage, via which the operating point of the second comparator 28 is controlled. Due to the adapted operating point of one of the comparators 22 or 28 the two comparators 22 and 28 have nearly the same behavior so a duty cycle mismatch is avoided because the duty cycle adapted by using the enhanced feedback control loop 52 is the same duty cycle generated by the main signal path 16. Consequently, the enhanced feedback control loop 52 enables providing a main signal with very low noise and jitter, wherein the targeted duty cycle is stable at varying input frequencies. The illustrated principle may be used for any duty cycle values. This approach for compensating the offset avoids lifetime and temperature drifts and thus provides an exact duty cycle under all circumstances.

FIG. 2b shows a comparison between the diagram of FIG. 1b and the similar diagram which shows the main signal 38 and the adjusted tracking signal 40'. As can be seen, the delay $d_a'$ between the falling edges of the two signals 38 and 40' is nearly equal to a delay $d_b'$ between the rising edges of the two signals (e.g., approx. 6 µs). Thus, the delay difference $(d_b-d_a)$ is reduced or even minimized to zero.

Figure 3:
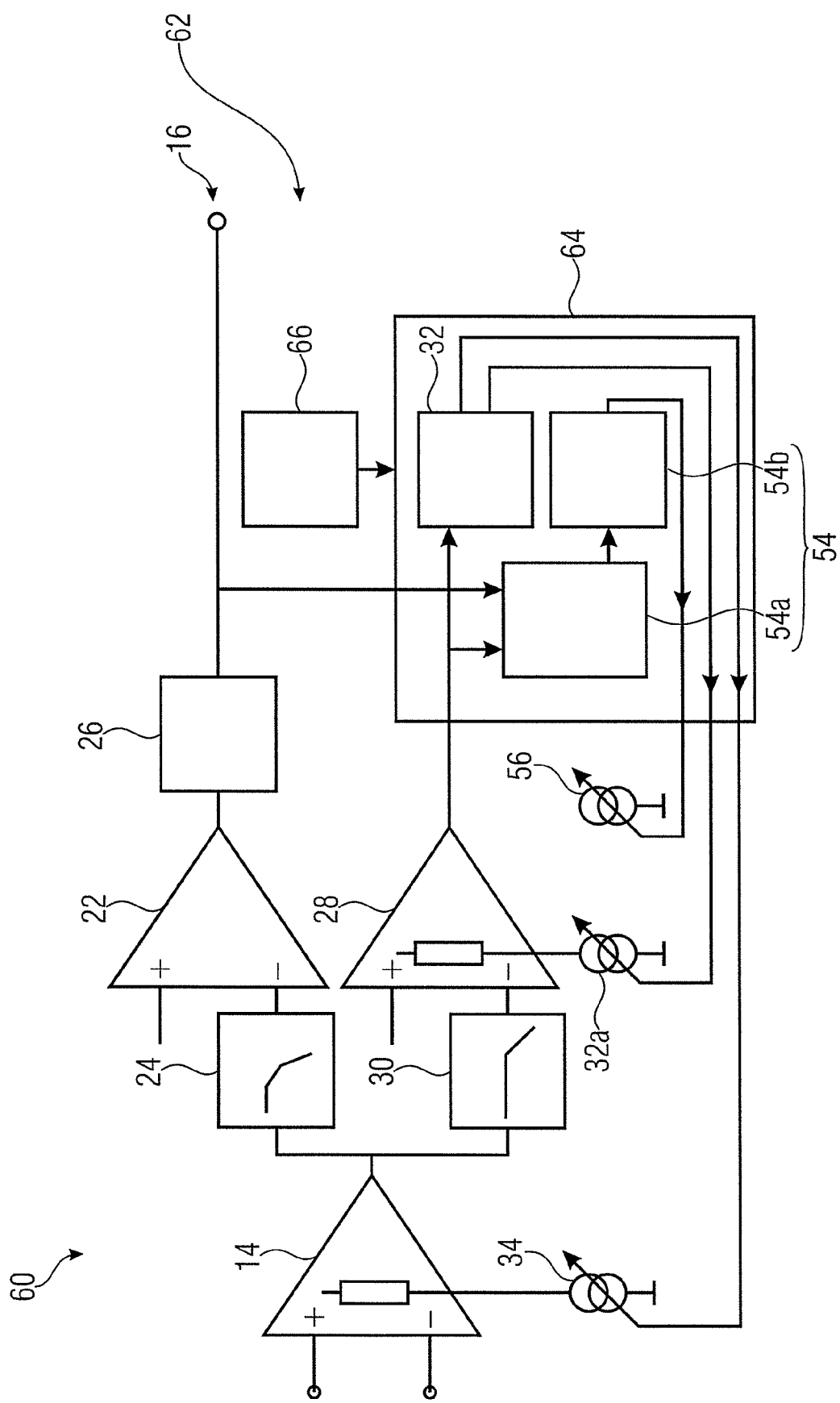
FIG. 3 is an example block diagram of a feedback control circuit for a Hall Effect device according to a further embodiment.

FIG. 3 shows a further implementation of a feedback control circuit 60 carrying an enhanced feedback control loop 62. The feedback control circuit 60 comprises, in contrast to the feedback control circuit 50 of FIG. 2a, the first low pass filter 24 and the enable logic 26 in the main signal path 16 as well as the second low pass filter 30 in the feedback control loop 62. Furthermore, the first signal evaluator 32 and the second signal evaluator 54 are combined into a digital signal processor 64 carrying three signal outputs for connecting the first controller 34, the second controller 56 and the tracking controller 32a. Furthermore, an oscillator 66 is connected to the digital signal processor 64. In this implementation, the second signal evaluator 54 is realized by a delay difference evaluator 54a and a digital integrator 54b.

The delay difference evaluator 54a measures the delay difference $(d_b-d_a)$ by counting the clocks of the oscillator 66. In other words, the delay difference evaluator 54a uses the oscillating signal output by the oscillator 66 as a time reference for the measurement. This measuring result is, in one embodiment, (low pass) filtered by digital means over many periods of the Hall Effect signal. Thus the digital integrator 54b is configured to integrate the measuring result of the delay difference evaluator 54a. This digital integrator 54b may, for example, be a simple up and down counter. The integrated signal is fed back to the second comparator 28 via the second controller 56 in order to cancel the mismatch between the first and second comparator 22 and 28, as explained above.

It should be noted that the two comparators 22 and 28 may be designed in one embodiment such that the first comparator 22 is optimized for low noise and low jitter, wherein the second comparator 28 is optimized for high speed. So, an auto zeroing or chopped comparator may be used as the second comparator 28 because it is not in the noise and jitter critical main signal path 16. Furthermore, it is not necessary to add a separate controller (cf. a second controller 56) for adjusting the operating point of the comparator 28. Thus, the operating point signal for balancing the second comparator 28 may alternatively be output via the tracking comparator 32a.

Figure 4A:
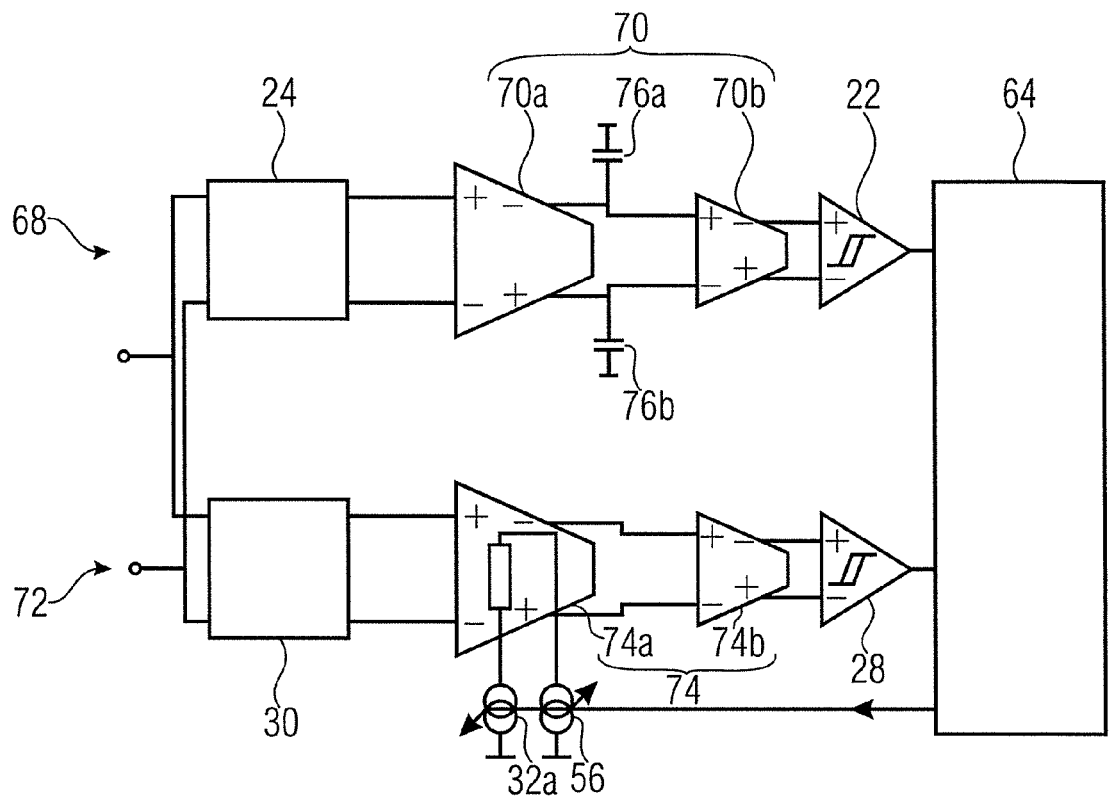
FIG. 4a is an example block diagram of a feedback control circuit comprising a comparator in combination with an amplifier in the main signal path and a comparator in combination with an adjustable amplifier in the tracking signal path during normal operation mode according to an embodiment.
Figure 4B:
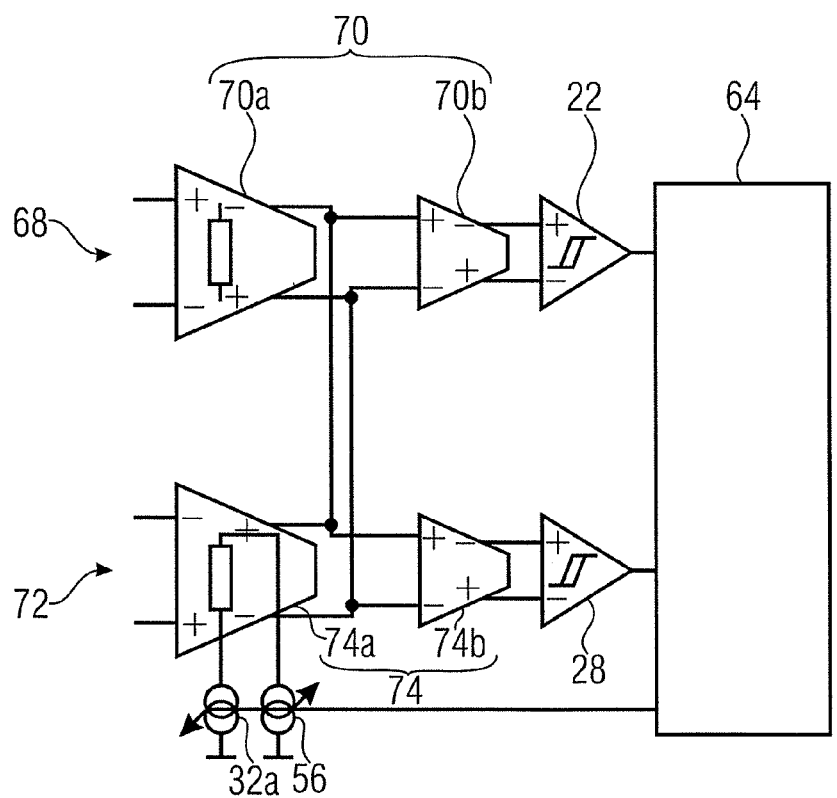
FIG. 4b is an example block diagram of the feedback control circuit of FIG. 4a during startup operation mode according to an embodiment.

FIG. 4a shows a further implementation of a main signal path 68 and tracking signal path 72 of a feedback control circuit, wherein the two signal paths 68 and 72 are configured to process differential signals. This feedback control circuit may be used in a normal operation mode (FIG. 4a) or in a startup operation mode (c.f. FIG. 4b).

In this implementation, the main signal path 68 comprises the filter 24 and the main comparator 22, wherein a multistage differential amplifier 70 comprising the two differential amplifiers 70a and 70b is arranged in between. The filter 24, the multistage amplifier 70 and the comparator 22 are connected in series to each other using two paired wires in order to process a differential signal. The comparator 22 which may have a hysteresis in one embodiment is configured to output a single-ended signal based on the differential signal processed in the main signal path 68. Note the second stage 74b of the differential amplifier 74 is arranged such that its minus terminals (at input and output side) are coupled to a plus terminal of the first stage 74a and to a plus terminal of the comparator 22, respectively. Vice versa, the respective plus terminals are coupled to minus terminals of the first amplification stage 74a and of the comparator 22.

Similarly, the tracking signal path 72 comprises the filter 30, the comparator 28 and a multistage differential amplifier 74 comprising two differential amplifiers 74a and 74b in between, wherein the elements of the tracking signal path 72 are also connected to each other by using two paired wires. Here, the second stage 70b is also arranged such that its plus terminals are connected to the minus terminals of the differential amplifier 74a and of the comparator 28 and such that its minus terminals to the respective plus terminals. Here, the comparator 28 also may have a hysteresis and is configured to output a single-ended signal based on the differential signal processed in the tracking signal path 72.

The feedback control loop further comprises the digital signal processor 64 (cf. FIG. 3) which is connected to the single-ended outputs of the first and the second comparator 22 and 28. In this implementation, the digital signal processor 64 is connected to the first stage 74a of the differential amplifier 74 of the tracking signal path 72 via the tracking controller 32a and via the second controller 56 for varying and adapting an operation point of the amplifier 74 and thus of the comparator 28. In other words, in one embodiment the two controllers 32a and 56 form the voltage supply of the first stage 74a of the differential amplifier 74, wherein the tracking controller 32a is connected to a first supply terminal of the differential amplifier 74a and the second controller 56 is connected to a second supply terminal of the differential amplifier 74a. Thus, the two controllers 32a and 56 and DACs, respectively, have the functionality of an adaptable current supply controlled via the digital signal processor 64 in order to sample the differential Hall Effect signal and to adapt the operation point of the second comparator 28. According to the above embodiments, the delay difference may be minimized by adapting the operation point of the second comparator 28 via the amplification stage 74a in this so-called normal operation mode.

This structure, having the two-stage differential amplifiers 70 and 74, enables to switch from the normal operation mode into a startup operation mode which is illustrated by FIG. 4b. FIG. 4b shows the differential amplifier 70 and the first comparator 22 in the main signal path 68 and the differential amplifier 74 and the second comparator 28 in the tracking signal path 72 in combination with the digital signal processor 64 and the two controllers 32a and 56 by which the first stage 74a of the differential amplifier 74 is controlled.

In the illustrated startup operation mode the main signal path 68 and the tracking signal path 72 are crossed. I.e. the first amplification stage 70a of the main signal path 68 is coupled to the corresponding second stage 70b of and to the second amplification stage 74b of the tracking signal path 72 such that its minus terminal is connected to the plus terminals of the second stages 70b and 74b, wherein the plus terminal is connected to the respective minus terminals. Vice versa, the first amplification stage 74a is coupled to the corresponding second stage 74b and to the second stage 70b of the main signal path 68. Here, the plus terminal of the first stage 74a is connected to the plus terminals of the second stages 70b and 74b, wherein the minus terminal is connected to the respective minus terminals. Due to this cross coupling the first amplification stages 70a and 74 are connected such that same are opposite poled.

Consequently, the two cross coupled amplifiers 70a and 74a counteract each other such that the currents in the two signal paths 68 and 72 are directly compared. So in case of an offset mismatch between the two comparators 22 and 28 a difference between the output currents is generated. In order to reduce the offset mismatch, the first stage 74a of the operational amplifier 74 is adjusted via the controller 56 until the output current difference is equal to zero. I.e., the offset mismatch is regulated by comparing the voltage difference of the main signal and the tracking signal during the startup operation mode. This startup operation mode enables a fast (initial) offset mismatch compensation.

Referring to FIG. 2a it should be noted that the second controller 56 may alternatively be connected to the first comparator 22 and outputs an operation point signal for shifting the operating point of the first comparator 22 in order to balance the component tolerances between the two comparators 22 and 28.

According to another embodiment, the second signal evaluator 54 is configured to detect another difference between a signal property of the main signal and the tracking signal, for example, a voltage difference based on which the second signal evaluator 54 performs the balancing of the two comparators 22 and 28.

According to a further embodiment the feedback control loop 52 is realized by an analog-to-digital-converter (tracking ADC) in combination with a digital signal processor having an integrated controller (means for digitally offsetting the tracking signal and for controlling the adjustable element 14). The tracking ADC comprising the second comparator 28 is configured to digitalize the tracking signal. This digitized tracking signal is the basis for calculating the offset control signal which is output by the digital signal processor. So, the first and second signal evaluator 32 and 54 and the first and second controller 34 and 56 are implemented in the digital signal processor (c.f. FIG. 3, digital signal processor 64). As discussed above, the mismatch between the two comparators 22 and 28 leads to a duty-cycle error which may be detected based on the signal property difference. Therefore, the digital signal processor is configured to control the adjustable element 14 in that way, that the delay time difference between rising and falling signal edges of the main signal and tracking signal is reduced. Here, the digital signal processor evaluates the digitized tracking signal and compares same to the main signal in order to detect a digital offset level. The digital offset level is used for correcting or for digitally compensating the mismatch between the tracking signal and the main signal. So, the digital signal processor outputs the offset control signal to the adjustable element 14 based on the (digital) tracking signal and based on the detected digital offset level. The digital signal processor may comprise means for digital summation and/or means for digital subtracting the tracking signal and the digital offset level to output an offset control signal in consideration of the mismatch. It should be noted that the principal of compensating the mismatch between the comparators 22 and 28 by adapting the offset control signal may also be used in combination with the structure of the feedback control loop 52 (c.f. FIG. 2a), wherein, in contrast to FIG. 2a, the second controller 56 is coupled to the adaptable element 14 in order to adapt the offset control signal of the first controller 34. So, the second signal evaluator 54 and the second controller 56, respectively, may be configured to adapt the offset control signal output by the first controller 34 in order to compensate the mismatch or in order to reduce the detected property difference between the main signal and the tracking signal.

Referring to FIG. 4a, it should be noted that the two output terminals of the first stage 70a of the differential amplifiers may optionally be coupled to ground via a capacitor 76a (for the minus terminal) and a capacitor 76b (for the plus terminal) in order to optimize the main signal path 68 to low noise.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:
1. A feedback control circuit for a Hall Effect device, comprising:
    an adjustable element configured to offset a signal of the Hall Effect device in accordance with an offset control signal, and configured to output an offset signal;
    a main signal path comprising a first comparator configured to process the offset signal to output a main signal; and
    a feedback control loop comprising:
        a second comparator configured to process the offset signal to output a tracking signal;
        a first signal evaluator configured to evaluate the tracking signal; and
        a first controller configured to output the offset control signal based on the evaluated tracking signal,
    wherein the feedback control loop further comprises:
        a second signal evaluator configured to detect a difference between a signal property of the main signal and the tracking signal; and
        a second controller configured to control one of the first comparator and the second comparator, or the adjustable element such that the difference is reduced.
2. The feedback control circuit according to claim 1, wherein the adjustable element is an amplifier having an offset level, and is configured to amplify the signal received from the Hall Effect device in accordance with the offset level, and configured to output the amplified signal to the main signal path and to the feedback control loop,
    wherein the offset level is adjustable via the offset control signal.

3. The feedback control circuit according to claim 1, wherein the first controller is a digital to analog converter configured to apply a current or a voltage as the offset control signal to the adjustable element such that an operating point of the adjustable element is set.

4. The feedback control circuit according to claim 1, wherein the main signal and the tracking signal are digital signals having rising and falling edges between a low level and a high level.

5. The feedback control circuit according to claim 1, wherein the difference between a signal property of the main signal and the tracking signal is a time difference associated with rising edges and falling edges of the main signal and the tracking signal.

6. The feedback control circuit according to claim 1, wherein the signal path comprises a first low pass filter arranged between the adjustable element and the first comparator, and
wherein the feedback control loop comprises a second low pass filter which is different from the first low pass filter and arranged between the adjustable element and the second comparator.

7. The feedback control circuit according to claim 6, wherein the first low pass filter is a combination of at least two low pass filters and the second low pass filter is a simple low pass filter having a faster filter response when compared to a filter response of the first low pass filter, and
wherein the main signal and the tracking signal have rising and falling edges, wherein a first delay between the rising edges of the main signal and the tracking signal and a second delay between the falling edges of the main signal and the tracking signal are caused by the different filter responses of the first and second low pass filter and by an offset difference between the main comparator and tracking comparator.

8. The feedback control circuit according to claim 7, wherein the difference between a signal property of the main signal and the tracking signal is a time difference between the first and second delay,
wherein the second signal evaluator comprises a delay difference evaluator configured to determine the time difference, and a digital integrator.

9. The feedback control circuit according to claim 8, wherein the second signal evaluator comprises an oscillator configured to output an oscillating signal that is used as a time reference for determining the time difference.

10. The feedback control circuit according to claim 1, wherein the first signal evaluator comprises a tracking controller configured to vary an operating point of the second comparator in order to sample the offset signal.

11. The feedback control circuit according to claim 10, wherein the tracking controller is a digital to analog converter configured to output a current or a voltage to the second comparator at a sampling frequency that is at least 10 times larger compared to a reciprocal of delay difference of the offset signal.

12. The feedback control circuit according to claim 10, wherein the first signal evaluator comprises a dither controller configured to output a high frequency signal to the second comparator in order to increase a sampling accuracy.

13. The feedback control circuit according to claim 1, wherein the second controller is a digital to analog converter configured to output an operating point signal such that an operating point of one of the first comparator and the second comparator is adjusted in order to balance component tolerances between the first comparator and the second comparator.

14. The feedback control circuit according to claim 13, wherein the second controller is configured to vary an operating point of the second comparator in order to sample the offset signal or configured to output a high frequency signal to the second comparator in order to increase a sampling accuracy, or both.

15. The feedback control circuit according to claim 1, wherein the difference between a signal property of the main signal and the tracking signal is a current difference or a voltage difference.

16. The feedback control circuit according to claim 1, wherein the first comparator or the second comparator, or both, comprise an amplifier.

17. The feedback control circuit according to claim 16, wherein one of the amplifiers is adjustable and controlled by the second controller.

18. The feedback control circuit according to claim 17, wherein the amplifiers of the first and/or second comparators are configured to be coupled during a startup phase such that an output of the adjustable amplifier of the first comparator is coupled to an output of the adjustable amplifier of the second comparator.

19. The feedback control circuit according to claim 1, wherein the first comparator or the second comparator, or both, are coupled to a Schmitt trigger such that the first comparator or the second comparator, or both, have a hidden hysteresis.

20. The feedback control circuit according to claim 1, wherein the offset control signal is selected such that the main signal has a predefined duty cycle.

21. The feedback control circuit according to claim 1, wherein the main signal path comprises a logic connected to the first comparator in series, and is configured to analyze the digital main signal.

22. The feedback control circuit according to claim 1, wherein the feedback control loop comprises an analog-to-digital-converter and a digital signal processor,
wherein the analog-to-digital-converter comprises the second comparator, and
wherein the first and second signal evaluator and the first and second controller are implemented by the digital signal processor, and configured to evaluate the tracking signal, to detect the difference between the signal property of the main signal and the tracking signal, and to output the offset control signal to the adjustable element in order to reduce the difference.

23. A feedback control circuit for a Hall Effect device, comprising:
an adjustable element configured to offset a signal of the Hall Effect device in accordance with an offset control signal, and configured to output an offset signal;
a main signal path comprising a first low pass filter and a first comparator configured to process the low pass filtered offset signal to output a digital main signal having a rising edge and a falling edge; and
a feedback control loop comprising a second low pass filter having a faster filter response when compared to a filter response of the first low pass filter, a second comparator configured to process the low pass filtered offset signal to output a digital tracking signal having a rising edge and a falling edge, a first signal evaluator configured to evaluate the tracking signal, and a first controller configured to output the offset control signal based on the evaluated tracking signal,
wherein a first delay between the rising edges of the main signal and of the tracking signal, and a second delay between the falling edges of the main signal and of the tracking signal are caused by the different filter responses of the first and second low pass filters and by an offset difference between the first comparator and the second comparator, wherein the feedback control loop comprises a second signal evaluator configured to determine a time difference between the first delay and the second delay, and a second controller configured to output an operating point signal to the second comparator such that an operating point of the second comparator is adjusted in order to balance component tolerances between the first comparator and the second comparator, wherein the operating point is adjusted until the time difference is reduced.

24. A feedback control circuit for a Hall Effect device, comprising:
means for offsetting a signal of the Hall Effect device in accordance with an offset control signal and for outputting an offset signal;
means for processing the offset signal to output a main signal;
means for processing the offset signal to output a tracking signal, means for evaluating the tracking signal, and for outputting the offset control signal based on the evaluated tracking signal; and
means for detecting a difference between a signal property of the main signal and the tracking signal, and for controlling one of the comparators or the means for offsetting such that the difference is reduced.

25. A regulated sensor, comprising:
a Hall Effect device; and
a feedback control circuit comprising:
an adjustable element configured to offset a signal of the Hall Effect device in accordance with an offset control signal and to output an offset signal,
a main signal path comprising a first comparator configured to process the offset signal to output a main signal, and
a feedback control loop comprising a second comparator configured to process the offset signal to output a tracking signal, a first signal evaluator configured to evaluate the tracking signal, and a first controller configured to output the offset control signal based on the evaluated tracking signal,
wherein the feedback control loop comprises a second signal evaluator configured to detect a difference between a signal property of the main signal and the tracking signal, and a second controller configured to control one of the first comparator and the second comparator, or the adjustable element such that the difference is reduced.

26. A method for regulating a Hall Effect device, comprising:
offsetting a signal of the Hall Effect device in accordance with an offset control signal;
outputting an offset signal;
processing the offset signal using a first comparator to output a main signal;
processing the offset signal using a second comparator to output a tracking signal;
evaluating the tracking signal;
outputting the offset control signal based on the evaluated tracking signal;
detecting a difference between a signal property of the main signal and the tracking signal; and
controlling one of the first comparator and the second comparator, or the control signal such that the difference is reduced.

* * * * *